(12) United States Patent
Motegi (10) Patent No.: US 8,115,425 B2
(45) Date of Patent: Feb. 14, 2012

(54) DRIVING APPARATUS, INDUSTRIAL INSTRUMENT, EXPOSURE APPARATUS, AND DEVICE MANUFACTURING METHOD

(75) Inventor: Yasuhiro Motegi, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 625 days.

(21) Appl. No.: 12/267,965

(22) Filed: Nov. 10, 2008

(65) Prior Publication Data

US 2009/0218964 A1 Sep. 3, 2009

(30) Foreign Application Priority Data

Mar. 3, 2008 (JP) ................................. 2008-052579

(51) Int. Cl.
*H02K 41/00* (2006.01)
*H02P 1/00* (2006.01)
*H02P 3/00* (2006.01)

(52) U.S. Cl. .......................... 318/135; 318/687; 318/695

(58) Field of Classification Search .................. 318/135, 318/695, 696; 361/695, 696
See application file for complete search history.

(56) References Cited

U.S. PATENT DOCUMENTS 7,267,086 B2 * 9/2007 Allen et al. ................. 123/41.44
2008/0098763 A1 * 5/2008 Yamaoka ..................... 62/259.2

FOREIGN PATENT DOCUMENTS

JP 2005-268546 9/2005

* cited by examiner

*Primary Examiner* — Walter Benson
*Assistant Examiner* — Erick Glass
(74) *Attorney, Agent, or Firm* — Fitzpatrick, Cella, Harper & Scinto

(57) ABSTRACT

A driving apparatus electrically drives first and second components built in an industrial instrument. The first component drives a first element, and the second component drives a second element at a velocity higher than that of the first component. The driving apparatus includes a housing including a supply inlet and an exhaust outlet. A fan forms an air current so that air is taken into the housing through the supply inlet and is exhausted from inside the housing through the exhaust outlet. A driving circuit block is accommodated in the housing so as to be cooled by the air current, and includes a first driving circuit to electrically drive the first component, and a second driving circuit to electrically drive the second component. The second driving circuit is inserted upstream of the first driving circuit along the air current in the housing. A cooling unit regulates a temperature of the air exhausted from inside the housing through the exhaust outlet so as to decrease a temperature difference between the air taken into the housing through the supply inlet and the air exhausted from inside the housing through the exhaust outlet.

9 Claims, 5 Drawing Sheets

DRIVING APPARATUS, INDUSTRIAL INSTRUMENT, EXPOSURE APPARATUS, AND DEVICE MANUFACTURING METHOD

This application claims the benefit of Japanese Patent Application No. 2008-052579, filed Mar. 3, 2008, which is hereby incorporated by reference herein in its entirety.

BACKGROUND OF THE INVENTION

1. Field of the Invention

The present invention relates to a driving apparatus, and an industrial instrument and an exposure apparatus, each including the driving apparatus, and a device manufacturing method of manufacturing a device using the exposure apparatus.

2. Description of the Related Art

An exposure apparatus for manufacturing a device, such as a semiconductor device or a liquid crystal device, is one example of industrial instruments. The exposure apparatus is constantly required to increase the throughput in order to improve the productivity. This makes it indispensible to drive the wafer stage and the reticle stage at higher velocities.

Linear motors are generally used as actuators that drive the wafer stage and the reticle stage. High-velocity driving requires increasing the acceleration of the wafer stage and the reticle stage, so a large thrust must be produced by, e.g., increasing an electrical current supplied to the linear motors or combining a plurality of linear motors to constitute one actuator. To meet these demands, linear motor driving circuits for driving the wafer stage and the reticle stage tend to have large-capacity outputs, and the number of outputs tends to increase. However, these tendencies lead to an increase in the heating values of the driving circuits and high-voltage power supplies for the driving circuits.

If heat generated by an industrial instrument, such as an exposure apparatus used in a temperature-controlled clean room, is directly exhausted, a heavy load is imposed on the clean room equipment. To avoid this situation, heat generated by, e.g., the driving circuits and power supplies, can be generally collected at a single site and exhausted outside the clean room through an exhaust duct (see Japanese Patent Laid-Open No. 2005-268546).

However, as the total heating value increases, the sectional area of the exhaust duct for exhausting the heat to the outside of the clean room must be increased. This reduces the effective space of the clean room. In addition, the scheme that exhausts heat to the outside of the clean room through the duct requires huge equipment.

In the clean room equipment, the sectional area of the exhaust duct and the flow rate of air supplied to it are generally determined, assuming the severest of conditions. However, all exposure apparatuses are less likely to always operate with maximum heating values, and their heating values upon driving the wafer stage and the reticle stage fluctuate depending on exposure conditions, such as the exposure shot size and the exposure pattern. If, for example, the exposure shot size is relatively large, the number of times of exposure per substrate is less than that if it is relatively small. In other words, the numbers of times of driving of the wafer stage and the reticle stage can be saved accordingly, resulting in a decrease in total heating value. In an extreme example, if the exposure apparatus is stopped due, e.g., to interlock, the wafer stage and the reticle stage are, in turn, stopped and, therefore, the heating values of the driving circuits become nearly zero. Considering these facts, the clean room equipment often continuously supplies more power than is necessary.

SUMMARY OF THE INVENTION

The present invention has been made in consideration of the above-described problem, and has as its object to save space necessary, e.g., to exhaust heat.

According to a first aspect, the present invention provides a driving apparatus which electrically drives a component built in an industrial instrument, the apparatus comprising a housing including a supply inlet and an exhaust outlet, a fan configured to form an air current so that air is taken into the housing through the supply inlet and exhausted from inside the housing through the exhaust outlet, a driving circuit block which is accommodated in the housing so as to be cooled by the air current, and configured to electrically drive the component, and a cooling unit configured to regulate a temperature of the air exhausted from inside the housing through the exhaust outlet so as to decrease a temperature difference between the air taken into the housing through the supply inlet and the air exhausted from inside the housing through the exhaust outlet.

According to a second aspect, the present invention provides an industrial instrument that includes a component and a driving apparatus which electrically drives the component, wherein the driving apparatus comprises a housing including a supply inlet and an exhaust outlet, a fan configured to form an air current so that air is taken into the housing through the supply inlet and exhausted from inside the housing through the exhaust outlet, a driving circuit block which is accommodated in the housing so as to be cooled by the air current, and configured to electrically drive the component, and a cooling unit configured to regulate a temperature of the air exhausted from inside the housing through the exhaust outlet, so as to decrease a temperature difference between the air taken into the housing through the supply inlet and the air exhausted from inside the housing through the exhaust outlet.

According to a third aspect, the present invention provides an exposure apparatus that includes an exposure unit which projects a pattern of an original held by an original stage onto a substrate held by a substrate stage to expose the substrate to light, and a driving apparatus which drives a component built in the exposure unit, wherein the driving apparatus comprises a housing including a supply inlet and an exhaust outlet, a fan configured to form an air current so that air is taken into the housing through the supply inlet and exhausted from inside the housing through the exhaust outlet, a driving circuit block which is accommodated in the housing so as to be cooled by the air current, and configured to electrically drive the component, and a cooling unit configured to regulate a temperature of the air exhausted from inside the housing through the exhaust outlet so as to decrease a temperature difference between the air taken into the housing through the supply inlet and the air exhausted from inside the housing through the exhaust outlet.

According to a fourth aspect, the present invention provides a device manufacturing method comprising the steps of exposing a substrate to light by the exposure apparatus discussed above, and developing the substrate exposed in the exposing step.

According to the present invention, it is possible to save space necessary, e.g., to exhaust heat.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings.

Figure 1:
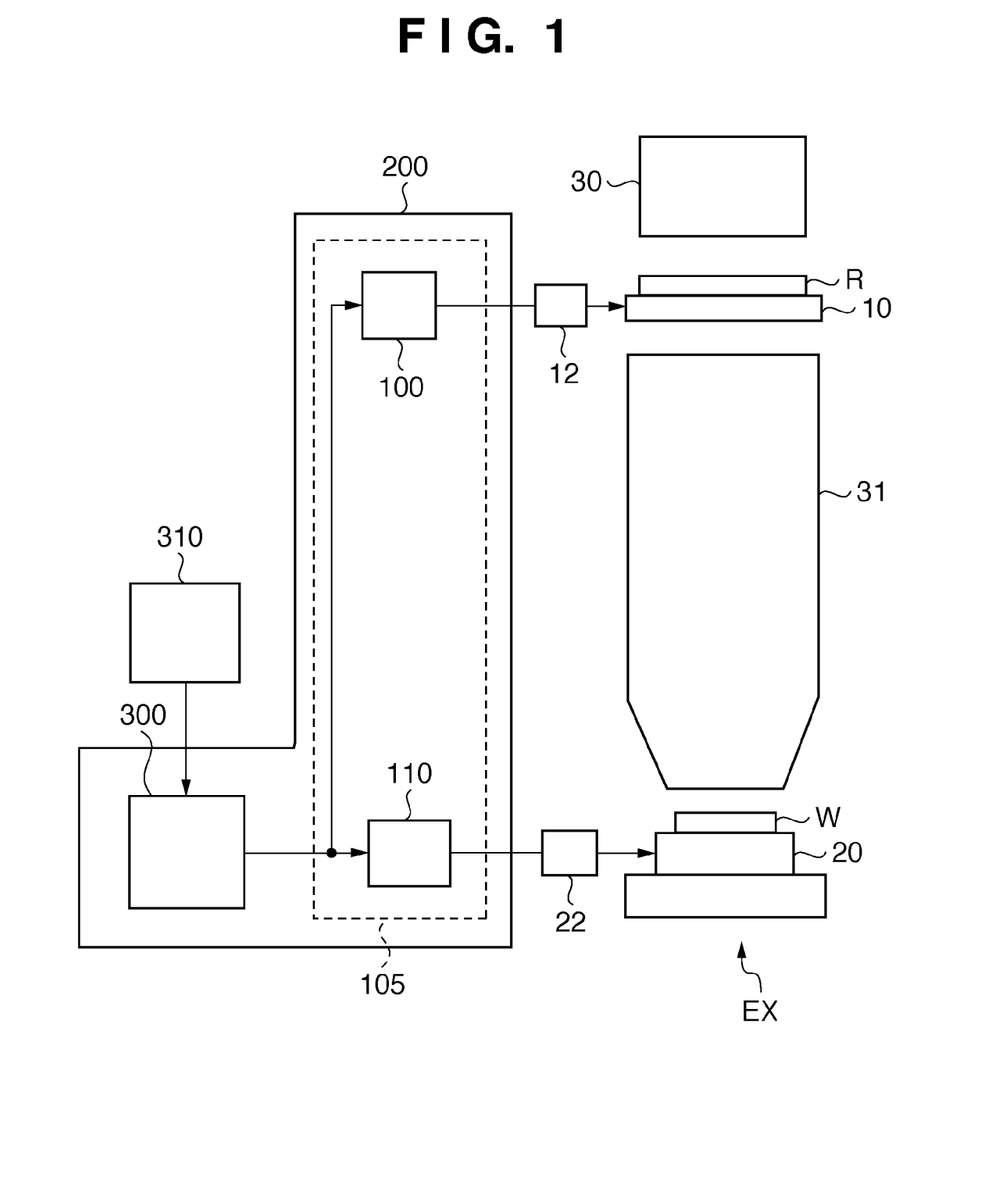
FIG. 1 is a diagram schematically showing the arrangement of an exposure apparatus as a preferred embodiment of an industrial instrument according to the present invention.

FIG. 1 is a diagram schematically showing the arrangement of an exposure apparatus as a preferred embodiment of an industrial instrument according to the present invention. The exposure apparatus according to the preferred embodiment of the present invention includes an exposure unit EX, a driving apparatus 200 for electrically driving components of the exposure unit EX, and a main controller 310.

The exposure unit EX mainly projects the pattern of a reticle (original) R held by a reticle stage (original stage) 10 onto a wafer (substrate) W held by a wafer stage (substrate stage) 20, thereby exposing the wafer W to light.

An illumination optical system 30 illuminates the reticle R with light emitted by a light source, such as a pulse laser. A projection optical system 31 projects the pattern of the reticle R illuminated onto the wafer W, thereby exposing the wafer W to light. By this exposure, a latent image is formed on the photosensitive agent applied on the wafer W. The latent image turns into a physical pattern upon being developed.

The wafer stage (first element) 20 is driven by a first driving mechanism (first component) 22. The first driving mechanism 22 includes an actuator, such as a linear motor, and is electrically driven by a first driving circuit 110 built in the driving apparatus 200. The reticle stage (second element) 10 is driven by a second driving mechanism (second component) 12. The second driving mechanism 12 includes an actuator, such as a linear motor, and is electrically driven by a second driving circuit 100 built in the driving apparatus 200. If the exposure apparatus is configured as a scanning exposure apparatus, it scan-drives the wafer stage 20 and the reticle stage 10 in synchronism with each other.

The positions of the wafer stage 20 and the reticle stage 10 are continuously detected by laser interferometers (not shown). On the basis of the positions detected by the laser interferometers, a controller 300 issues driving instructions to the first driving circuit 110 and the second driving circuit 100 of the driving apparatus 200, to position the wafer stage 20 and the reticle stage 10 to target positions or to move them along target tracks.

The wafer stage 20 and the reticle stage 10 can be generally driven by the linear motors serving as the first driving mechanism 22 and the second driving mechanism 12, while being levitated above the base by, e.g., air pressure or a magnetic force. Along with the recent improvement in productivity, the accelerations and scanning velocities of the wafer stage 20 and the reticle stage 10 tend to increase. Until now, the acceleration and scanning velocity of the wafer stage (first element) 20 have reached 1.5 G and 600 mm/s, respectively, and those of the reticle stage (second element) 10 have reached 6 G and 2,400 mm/s, respectively.

In an exposure apparatus for manufacturing a semiconductor device, the projection optical system 31 is typically configured as a reduction projection optical system, which drives the reticle stage (second element) 10 at a velocity higher than that of the wafer stage (first element) 20. For this reason, the heating value of the first driving circuit 110, which electrically drives the first driving mechanism (first component) 22 for the wafer stage 20, can be larger than that of the second driving circuit 100, which electrically drives the second driving mechanism (second component) 12 for the reticle stage 10. To obtain the above-described accelerations and velocities, circuits including class-D amplifiers, which attain both high power and high efficiency, are generally suitable as the driving circuits 110 and 100.

The main controller 310 issues an instruction to the controller 300 to drive the wafer stage 20 and the reticle stage 10 in accordance with an exposure job. Twenty-five wafers, for example, are exposed in one exposure job (one lot). After one exposure job is ended, the exposure stands by until the main controller 310 receives an instruction to start the next exposure job.

Figure 2:
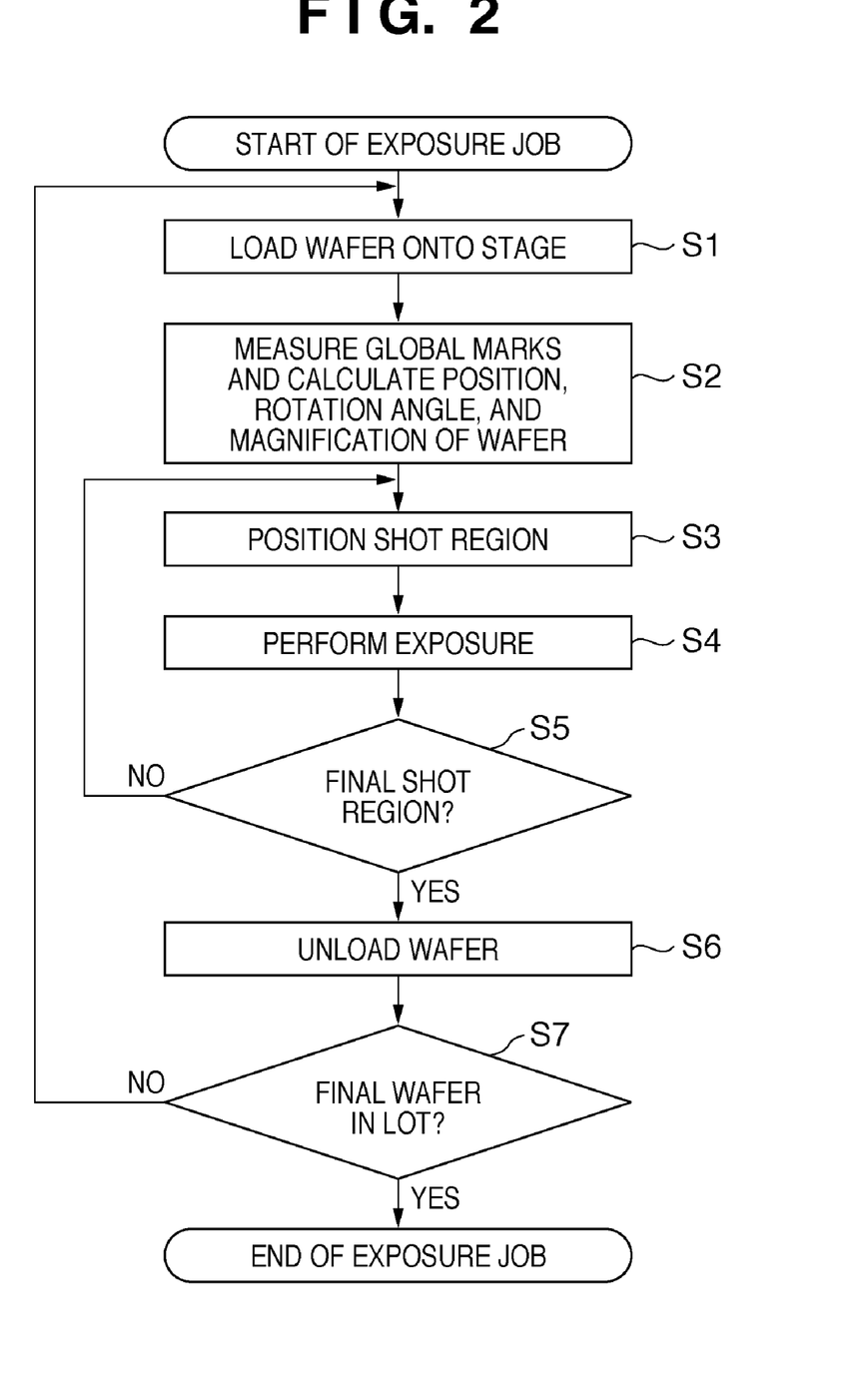
FIG. 2 is a flowchart illustrating an example of the sequence of an exposure job.

FIG. 2 is a flowchart illustrating an example of the sequence of an exposure job. This sequence is controlled by the main controller 310. In response to an instruction to start the exposure job, a wafer in a wafer carrier is extracted by a wafer conveyance system (not shown), is aligned, and is loaded onto a wafer chuck mounted on the wafer stage 20, in step S1. This wafer is held on the wafer chuck by suction.

In step S2, the positions of a plurality of global marks (also called alignment marks) formed on the wafer are measured. On the basis of the measurement result, the position, rotation angle, magnification, and the like, of the wafer are calculated.

In step S3, a shot region to be exposed on the wafer is positioned. In step S4, the shot region is exposed.

In step S5, it is checked whether all shot regions on the wafer have been exposed. If YES in step S5, the wafer is unloaded in step S6. If NO in step S5, the process returns to step S3.

In step S7, it is checked whether all wafers in the lot have been exposed. If YES in step S7, the exposure job is ended. If NO in step S7, the process returns to step S1. After the exposure job is ended, the exposure apparatus stands by until an instruction to start the next exposure job is issued.

In the above-described exposure job, the controller 300 controls the first driving circuit 110 and the second driving circuit 100 in accordance with their driving profiles determined based on exposure job control information provided by the main controller 310. Note that the driving profiles can be temporal changes in current values to be output from the first driving circuit 110 and the second driving circuit 100. In a constant-velocity interval in which the wafer stage 20 and the reticle stage 10 are moved at constant velocities, their functional forces need not always be taken into consideration because they are levitated above the base by, e.g., air pressure. Because there is theoretically no need to produce a thrust in the constant-velocity interval, electrical currents output from the first driving circuit 110 and the second driving circuit 100 may be neglected.

The heating values of the first driving circuit 110 and the second driving circuit 100 upon driving the wafer stage 20 in order to load a wafer onto the wafer stage 20 (step S1) and to unload the wafer from the wafer stage 20 (step S6) are common among all wafers.

The heating values of the first driving circuit 110 and the second driving circuit 100, upon driving the wafer stage 20 in order to perform global mark measurement (step S2), depend on the number of sample shots of a global mark measurement target designated in the exposure job.

The heating values of a driving circuit block 105 in steps S3 to S5 depend on the size of an exposure shot region designed in the exposure job, the accelerations and decelerations of the stages 10 and 20 before and after the exposure, and the duty ratio between the acceleration/deceleration times before and after the exposure and the constant-velocity time during the exposure.

With the above-described operation, the time average power necessary for the driving circuit block 105, including the first driving circuit 110 and the second driving circuit 100 in steps S1 to S6, in the exposure job (the average power in the exposure job), can be approximately calculated by:

$$\{(Q1+Q3 \times M3+Q2 \times M2) \times M1\}/T \quad (1)$$

where Q1 is the power required for acceleration and deceleration in loading a wafer onto the wafer stage and in unloading the wafer, Q2 is the power per shot required for acceleration and deceleration in global mark measurement, Q3 is the power per shot required for acceleration and deceleration in exposure, M1 is the number of wafers, M2 is the number of sample shots in global mark measurement, M3 is the number of shots, and T is the time required for steps S1 to S6.

If the first driving circuit 110 and the second driving circuit 100 are class-D amplifiers of the PWM scheme, a heating value (power dissipation) Pdiss of the driving circuit block 105, including the first driving circuit 110 and the second driving circuit 100, can be calculated by:

$$Pdiss = Pout/A - Pout \quad (2)$$

where Pout is the sum total of power supplied to the driving circuit block 105, including the first driving mechanism 22 and the second driving mechanism 12, to drive the wafer stage 20 and the reticle stage 10, and A is the overall efficiency of the driving circuit block 105, including the first driving circuit 110 and the second driving circuit 100.

The efficiency A depends on the current versus load characteristic of the driving circuit block 105, and can be approximated by a polynomial using its output current as a parameter. Hence, the controller 300 can estimate the overall heating value of the driving circuit block 105 on the basis of the average power consumed in the exposure job.

Figure 3:
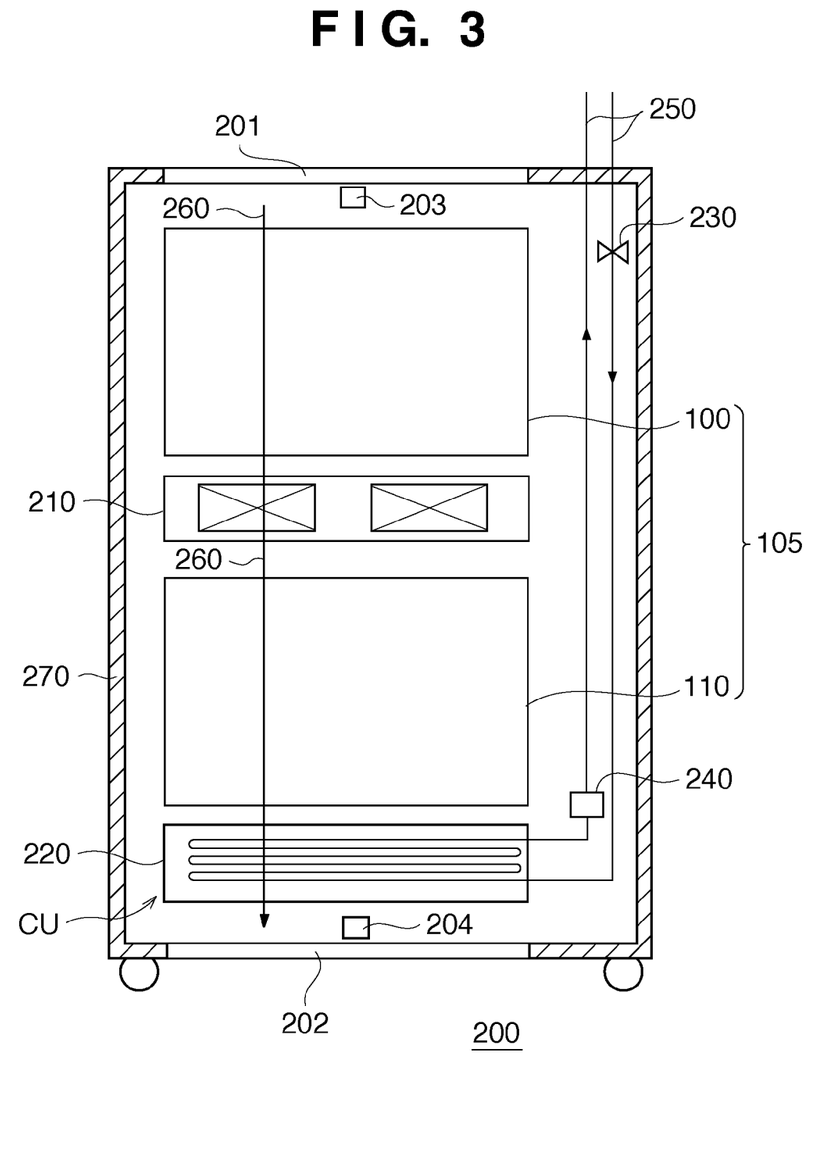
FIG. 3 is a view showing an arrangement example of a driving apparatus.

FIG. 3 is a view showing an arrangement example of the driving apparatus 200. The driving apparatus 200 includes a housing 270, a fan 210, the driving circuit block 105, and a cooling unit CU. The housing 270 has a supply inlet 201 and an exhaust outlet 202. The fan 210 is arranged in one or both of inside and outside of the housing 270, and forms an air current 260 so that air is taken into the housing 270 through the supply inlet 201 and exhausted from inside the housing 270 through the exhaust outlet 202. The driving circuit block 105 is accommodated in the housing 270 so as to be cooled by the air current 260 formed by the fan 210. In this embodiment, the driving circuit block 105 includes the first driving circuit 110 which electrically drives the first driving mechanism 22, and the second driving circuit 100 which electrically drives the second driving mechanism 12.

As described above, the heating value of the first driving circuit 110 which electrically drives the first driving mechanism 22 for the wafer stage 20 can be larger than that of the second driving circuit 100 which electrically drives the second driving mechanism 12 for the reticle stage 10. To cope with this situation, the second driving circuit 100 is preferably inserted upstream of the first driving circuit 110 along the air current 260, i.e., on a side where the temperature of the air is relatively low in the housing 270.

The cooling unit CU regulates the temperature of the air exhausted from inside the housing 270 through the exhaust outlet 202 so as to decrease the temperature difference between the air taken into the housing 270 through the supply inlet 201 and the air exhausted from inside the housing 270 through the exhaust outlet 202. The cooling unit CU can include a heat exchanger 220 and a flow channel 250 for supplying a liquid coolant to the heat exchanger 220 and recovering the liquid coolant from the heat exchanger 220. In the heat exchanger 200, the temperature of the air decreases as the liquid coolant removes heat of the air circulating through it.

The heat exchanger 220 preferably cools the air so that it is exhausted from the housing 270 upon being regulated to the same temperature as that of the external space (a space which accommodates the driving apparatus 200, typically, the space in the clean room). To attain this state, the heat exchanger 220 is preferably set at a position close to the exhaust outlet 202, that is, the position between the driving circuit block 105 and the exhaust outlet 202.

If the driving circuit block 105, and the like, may exhaust dust, a filter is preferably set at a proper position, such as the position between the heat exchanger 220 and the exhaust outlet 202 or the position of the exhaust outlet 202.

To control the cooling capacity of the cooling unit CU, the driving apparatus 200 includes a solenoid-operated valve 230 for controlling the flow rate of the liquid coolant flowing through the flow channel 250, and a flow sensor 240 for detecting the flow rate of the liquid coolant flowing through the flow channel 250.

Note that the solenoid-operated valve 230 preferably has a degree of opening and heat exchange amount (cooling capacity) which hold a linear relationship, that is, can perform proportional control, but this function is dispensable.

The temperature of the liquid coolant supplied to the heat exchanger 220 is preferably constant, but this condition is dispensable. The exposure apparatus preferably uses a liquid coolant such as brine, C-OIL, or pure water for use in precise temperature control in the exposure unit EX. For industrial instruments, such as a testing machine which cannot meet such a condition, general plant cooling water can be used. Instead of a liquid coolant (a liquid), a gas may be used as the fluid supplied to the heat exchanger 220. The cooling unit CU can be a heat pump.

The driving apparatus 200 preferably includes temperature sensors 203 and 204 to detect the temperature difference between the air taken into the housing 270 through the supply inlet 201 and the air exhausted from inside the housing 270 through the exhaust outlet 202. On the basis of the temperature difference detected by the temperature sensors 203 and 204, the solenoid-operated valve 230 can be feedback-controlled so as to decrease the temperature difference. One temperature sensor 203 can be set at a position where it can detect the temperature of the external space (external temperature), such as in the vicinity of the supply inlet 201. The other temperature sensor 204 can be set at a position where it can detect the temperature of the air exhausted from the housing 270, such as in the vicinity of the exhaust outlet 202.

To reduce the influence that the driving apparatus 200 inflicts on its external space, the temperature of the air exhausted from the exhaust outlets 202 is preferably equal to that of the air taken into the housing 270 from the supply inlet 201, i.e., that of the external space of the driving apparatus 200. However, the air exhausted from the exhaust outlet 202 may be controlled to an arbitrarily set temperature.

The cooling capacity of the cooling unit CU, i.e., the heat exchanging capacity of the heat exchanger 220 is determined by the physical properties of the liquid coolant, the temperature of the entrance of the heat exchanger 220, and the air blowing rate of the fan 210. When the temperature of the liquid coolant and the air blowing rate of the fan 210 are constant, the required flow rate of the liquid coolant depends on only the heating value of the driving circuit block 105. Using this principle, the flow rate of the liquid coolant with respect to the estimated heating value can be determined based on the relationship between the heating value of the driving circuit block 105 when its load condition is varied, and the flow rate of the liquid coolant at which the temperature of the air exhausted from the exhaust outlet 202 is equal to the external temperature.

Factors that make the temperature control of the air exhausted from the exhaust outlet 202 deviate from the above-described relationship include a fluctuation in the temperature of the liquid coolant, a fluctuation in the air blowing rate of the fan 210, and the non-linear characteristics of the heat exchanger 220 and the solenoid-operated valve 230. A fluctuation in the temperature of the air exhausted from the exhaust outlet 202 due to these factors can be suppressed by regulating the flow rate of the liquid coolant flowing through the heat exchanger 220 by temperature feedback using the temperature sensors 203 and 204.

Figure 4:
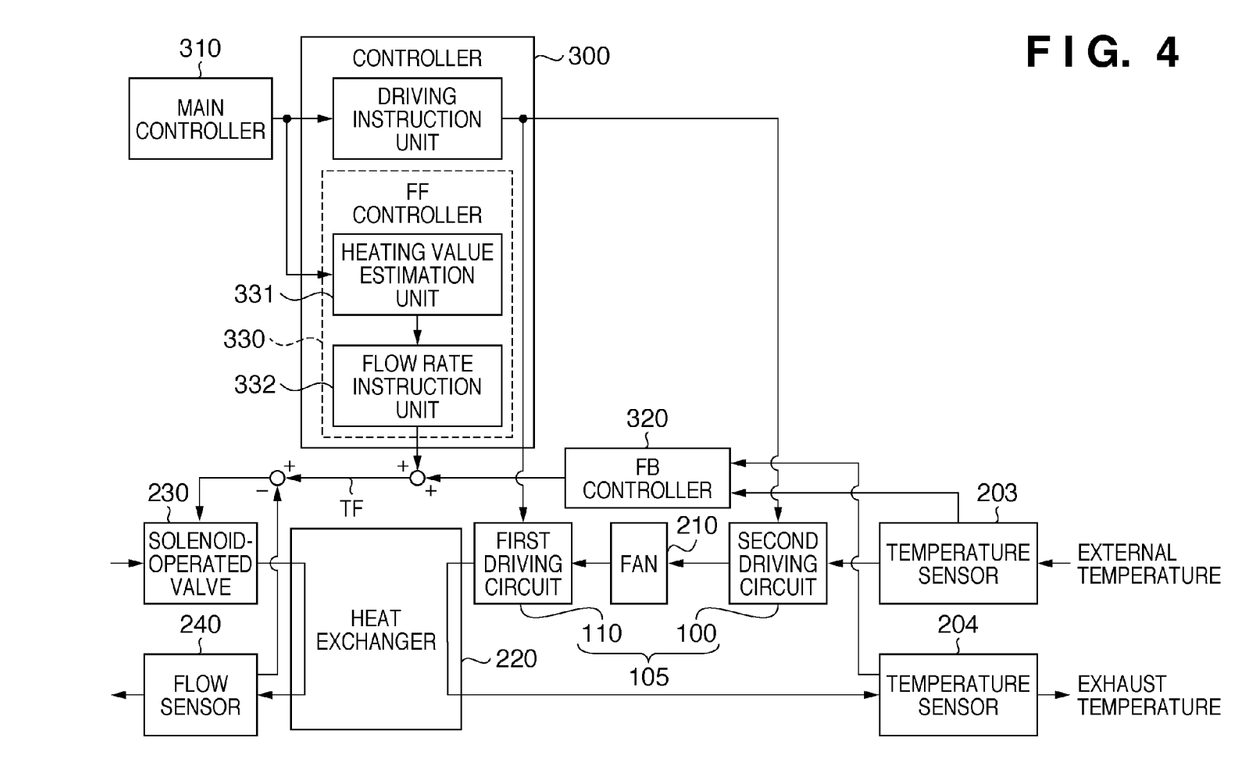
FIG. 4 is a block diagram showing a temperature control system built in the exposure apparatus shown in FIG. 1.

FIG. 4 is a block diagram showing a temperature control system built in the exposure apparatus shown in FIG. 1. The first driving circuit 110 and the second driving circuit 100 are cooled by taking air from the external space into the housing 270 by the fan 210. The air, the temperature of which has risen as it removes heat generated by the first driving circuit 110 and the second driving circuit 100, is cooled and exhausted to the external space by the heat exchanger 220.

The flow rate of the liquid coolant flowing through the heat exchanger 220 is detected by the flow sensor 240 and controlled by the solenoid-operated valve 230. For example, the degree of opening of the solenoid-operated valve 230 can be controlled based on any deviation of the flow rate detected by the flow sensor 240 from a target flow rate TF. The cooling capacity of the heat exchanger 220 can be regulated by controlling the flow rate of the liquid coolant.

The controller 300 includes a feedforward controller (to be abbreviated as an FF controller hereafter) 330. The FF controller 330 includes a heating value estimation unit 331 and a flow rate instruction unit 332. The heating value estimation unit 331 calculates (estimates) the heating value of the driving circuit block 105, including the first driving circuit 110 and the second driving circuit 100 on the basis of expressions (1) and (2), in accordance with the driving profiles of the first driving circuit 110 and the second driving circuit 100. The controller 300 can determine the driving profiles on the basis of exposure job control information provided by the main controller 310. This heating value can be calculated as a time average value, as described above. On the basis of the heating value estimated by the heating value estimation unit 331, the flow rate instruction unit 332 issues a flow rate instruction value to the solenoid-operated valve 230 to suppress or to cancel a rise in the temperature of the air due to the heating value in the housing 270. With this operation, the temperature of the air exhausted from the housing 270 is feedforward-controlled based on the driving profiles.

The heating value output from the heating value estimation unit 331 is an estimate based on the driving profiles, so it can contain a small error from the actual heating value of the driving circuit block 105, including the first driving circuit 110 and the second driving circuit 100. Therefore, the feedforward control of the solenoid-operated valve 230 by the FF controller 330 alone may be insufficient to attain a sufficiently high precision of controlling the temperature of the air exhausted from the housing 270.

Also, the temperature of the liquid coolant supplied to the heat exchanger 220 may fluctuate. The air blowing rate of the fan 210 may fluctuate due to, e.g., its deterioration.

To take them into consideration, a feedback controller (to be abbreviated as an FB controller hereafter) 320 issues a flow rate instruction value to the solenoid-operated valve 230 on the basis of the output from the temperature sensor 204, which detects the temperature of the air exhausted from the housing 270, and the output from the temperature sensor 203, which detects the temperature of the external space. With this operation, the temperature of the air exhausted from the housing 270 is feedback-controlled. The FB controller 320 can include, e.g., a PID compensator for performing the PID arithmetic operation of the difference (i.e., the temperature deviation) between the outputs from the temperature sensors 204 and 203, to issue a flow rate instruction value.

In this embodiment, the flow rate instruction values output from the FF controller (first controller) 330 and FB controller (second controller) 320 are added to each other to generate a final target flow rate TF.

The heating value of the driving circuit block 105 changes depending on its state. The state of the driving circuit block 105 can include a plurality of states. The number of states is arbitrarily determined in response to a demand for the flow rate control precision of the FF controller 330. To increase the flow rate control precision, the state of the driving circuit block 105 need only be classified in more detail.

Figure 5:
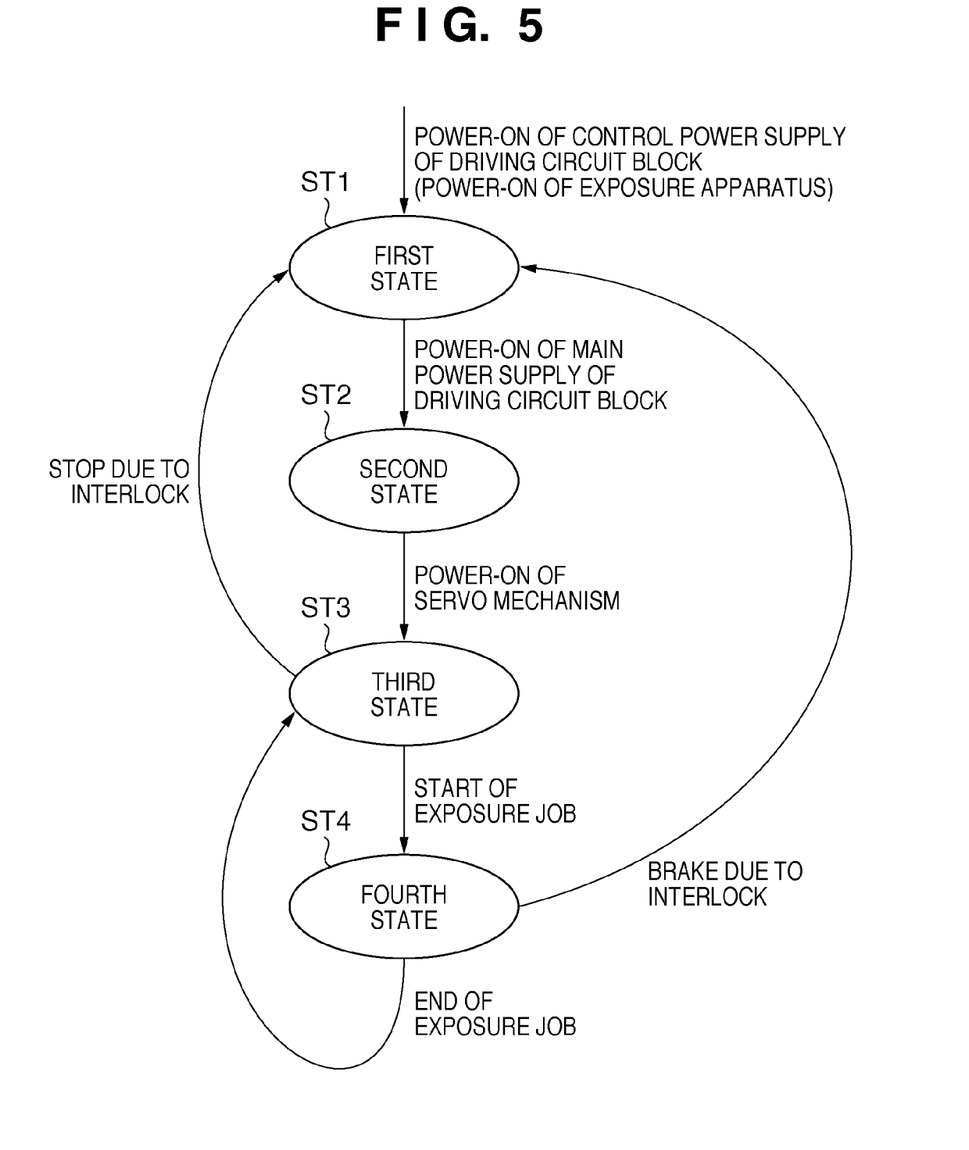
FIG. 5 is a diagram showing the state transition of a driving circuit block.

FIG. 5 is a diagram showing the state transition of the driving circuit block 105. Note that the state of the driving circuit block 105 can also be interpreted as being the state of the exposure apparatus. In the example shown in FIG. 5, the state of the driving circuit block 105 can include a first state ST1, a second state ST2, a third state ST3, and a fourth state ST4.

As a power supply for controlling the driving circuit block 105 is turned on upon turning on the power supply of the exposure apparatus, the state of the driving circuit block 105 changes to the first state ST1. As the main power supply of the driving circuit block 105 is turned on in the first state ST1, the state of the driving circuit block 105 changes from the first state ST1 to the second state ST2. As a positioning mechanism (servo mechanism) of the wafer stage 20 and the reticle stage 10 is turned on in the second state ST2, the state of the driving circuit block 105 changes from the second state ST2 to the third state ST3. As an exposure job starts in the third state ST3, the state of the driving circuit block 105 changes from the third state ST3 to the fourth state ST4. As the exposure job is ended, the state of the driving circuit block 105 changes from the fourth state ST4 to the third state ST3. In addition, if the exposure apparatus has fallen into an interlock condition, the main power supply of the driving circuit block 105 is turned off (the state of driving circuit block 105 changes to the first state ST1), and the wafer stage 20 and the reticle stage 10 can be braked or the servo mechanism can be stopped.

The first state ST1 is a state in which the power supply necessary to control the driving circuit block 105 by the controller 300 is ON. The second state ST2 is a state in which the main power supply of the driving circuit block 105 is ON. Both in the first state ST1 and the second state ST2, the heating value of the driving circuit block 105 is constant. In view of this, the FF controller 330 preferably issues a first flow rate instruction value to the solenoid-operated valve 230 in the first state ST1, and issues a second flow rate instruction value to the solenoid-operated valve 230 in the second state ST2. With this operation, flow rate instruction values to suppress or to cancel a rise in the temperature of the air exhausted from the housing 270 are issued to the solenoid-operated valve 230 in the first state ST1 and the second state ST2. The first and second flow rate instruction values can be determined as estimates based on, e.g., calculation or actual measurement.

The third state ST3 is a state in which the positioning mechanism (servo mechanism) of the wafer stage 20 and the reticle stage 10 is ON. In this state, the first driving mechanism 22 and the second driving mechanism 12 are electrically driven by the first driving circuit 110 and the second driving circuit 100, respectively, to position the wafer stage 20 and the reticle stage 10 to target positions. Because the wafer stage 20 and the reticle stage 10 stand still in the third state ST3, the power consumption of the driving circuit block 105 including the first driving circuit 110 and the second driving circuit 100 in the third state ST3 is less than that in the fourth state ST4.

In the third state ST3, the power consumption of the driving circuit block 105 is nearly constant, and the FF controller 330 issues a third flow rate instruction value to the solenoid-operated valve 230. With this operation, a flow rate instruction value to suppress or to cancel a rise in the temperature of the air exhausted from the housing 270 is issued to the solenoid-operated valve 230 in the third state ST3. The third flow rate instruction value can be determined as being an estimate based on, e.g., calculation or actual measurement.

The fourth state ST4 is a state in which an exposure job as illustrated in FIG. 2 is executed. In the fourth state ST4, the wafer stage 20 and the reticle stage 10 are driven in accordance with their driving profiles individually determined according to the exposure job, and the driving circuit block 105 generates heat according to this driving. To cope with this situation, the FF controller 330 controls the heating value estimation unit 331 to estimate the heating value of the driving circuit block 105, and controls the flow rate instruction unit 332 to issue a flow rate instruction value according to the heating value to the solenoid-operated valve 230.

As described above, according to this embodiment, assuming a driving apparatus which electrically drives a component built in an industrial instrument, air is exhausted outside the driving apparatus after its temperature is decreased sufficiently. This makes it possible to save a space necessary to exhaust heat. It is also possible to reduce the influence that the driving apparatus inflicts on its external space by regulating the cooling capacity of the cooling unit of the driving apparatus on the basis of the heating value of the driving circuit block accommodated in the housing of the driving circuit. It is also possible to enhance the cooling capacity regulation response characteristic of the cooling unit of the driving apparatus to a fluctuation in the heating value of the driving circuit block by regulating the cooling capacity of the cooling unit on the basis of the estimate of the heating value of the driving circuit block.

Although the temperature of the liquid coolant and the air blowing rate of the fan 210 are assumed to be constant, for the sake of simplicity, in the above-described example, changing these conditions makes it possible to further improve the temperature control precision.

The industrial instrument according to the present invention is not particularly limited to an exposure apparatus, and the present invention is applicable to all industrial instruments having heat generating elements. Such industrial instruments include, e.g., a bonding apparatus, a semiconductor manufacturing apparatus, such as a prober, an industrial robot, and an NC machine.

A device manufacturing method using the above-described exposure apparatus will be explained next. A device (e.g., a semiconductor integrated circuit device or a liquid crystal display device) is manufactured by a step of exposing a substrate (e.g., a wafer or a glass plate) coated with a photosensitive agent, to light, using the exposure apparatus according to the above-described embodiment, a step of developing the substrate exposed in the exposing step, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A driving apparatus which electrically drives first and second components built in an industrial instrument, the first component being configured to drive a first element, and the second component being configured to drive a second element at a velocity higher than that of the first component, the driving apparatus comprising:
a housing including a supply inlet and an exhaust outlet;
a fan configured to form an air current so that air is taken into said housing through said supply inlet and exhausted from inside said housing through said exhaust outlet;
a driving circuit block which is accommodated in said housing so as to be cooled by the air current, and which includes a first driving circuit configured to electrically drive the first component, and a second driving circuit configured to electrically drive the second component, wherein said second driving circuit is inserted upstream of said first driving circuit along the air current in said housing; and
a cooling unit configured to regulate a temperature of the air exhausted from inside said housing through said exhaust outlet so as to decrease a temperature difference between the air taken into said housing through said supply inlet and the air exhausted from inside said housing through said exhaust outlet.

2. The apparatus according to claim 1, further comprising a first controller configured to control a cooling capacity of said cooling unit based on a heating value of said driving circuit block.

3. The apparatus according to claim 2, wherein said first controller controls the cooling capacity of said cooling unit based on an estimate of the heating value of said driving circuit block according to a state of said driving circuit block.

4. The apparatus according to claim 1, further comprising:
a temperature sensor configured to detect the temperature of the air exhausted from inside said housing through said exhaust outlet; and
a second controller configured to control a cooling capacity of said cooling unit based on the output from said temperature sensor.

5. The apparatus according to claim 1, wherein said cooling unit includes a heat exchanger, and a cooling capacity of said cooling unit is controlled by a flow rate of a fluid supplied to said heat exchanger.

6. The apparatus according to claim 1, wherein
the industrial instrument includes an exposure unit which projects a pattern of an original held by an original stage onto a substrate held by a substrate stag; to expose the substrate to light, and
the first component includes a first driving mechanism which drives the substrate stage, and the second component includes a second driving mechanism which drives the original stage.

7. An industrial instrument including first and second components and a driving apparatus which electrically drives the first and second components, the first component being configured to drive a second element at a velocity higher than that of the first component,
wherein the driving apparatus comprises:
(i) a housing including a supply inlet and an exhaust outlet;
(ii) a fan configured to form an air current so that air is taken into said housing through said supply inlet and exhausted from inside said housing through said exhaust outlet;
(iii) a driving circuit block which is accommodated in said housing so as to be cooled by the air current, and which includes a first driving circuit configured to electrically drive the first component, and a second diving circuit configured to electrically drive the second component, wherein said second driving circuit is inserted upstream of said first driving circuit along the air current in said housing; and
(iv) a cooling unit configured to regulate a temperature of the air exhausted from inside said housing through said exhaust outlet so as to decrease a temperature difference between the air taken into said housing through said supply inlet and the air exhausted from inside said housing through said exhaust outlet.

8. An exposure apparatus including an exposure unit which projects a pattern of an original held by an original stage onto a substrate held by a substrate stage to expose the substrate to light, and a driving apparatus which drives first and second components of the exposure unit, the first component being configured to drive a first element of the exposure unit, and the second component being configured to drive a second element of the exposure unit at a velocity higher than that of the first component,
wherein the driving apparatus comprises:
(i) a housing including a supply inlet and an exhaust outlet;
(ii) a fan configured to form an air current so that air is taken into said housing through said supply inlet and exhausted from inside said housing through said exhaust outlet;
(iii) a driving circuit block which is accommodated in said housing so as to be cooled by the air current, and which includes a first driving circuit configured to electrically drive the first component, and a second driving circuit configured to electrically drive the second component, wherein said second driving circuit is inserted upstream of said first driving circuit along the air current in said housing; and
(iv) a cooling unit configured to regulate a temperature of the air exhausted from inside said housing through said exhaust outlet so as to decrease a temperature difference between the air taken into said housing through said supply inlet and the air exhausted from inside said housing through said exhaust outlet.

9. A device manufacturing method comprising the steps of:
(A) exposing a substrate to light by an exposure apparatus; and
(B) developing the substrate exposed in the exposing step,
wherein the exposure apparatus includes (a) an exposure unit which projects a pattern of an original held by an original stage onto a substrate held by a substrate stag; to expose the substrate to light, and (b) a driving apparatus which drives first and second components of the exposure unit, the first component being configured to drive a first element, and the second component being configured to drive a second element at a velocity higher than that of the first component, and
the driving apparatus comprises:
(i) a housing including a supply inlet and an exhaust outlet;
(ii) a fan configured to form an air current so that air is taken into said housing through said supply inlet and exhausted from inside said housing through said exhaust outlet;
(iii) a driving circuit block which is accommodated in said housing so as to be cooled by the air current, and which includes a first driving circuit configured to electrically drive the first component, and a second driving circuit configured to electrically drive the second component, wherein said second driving circuit is inserted upstream of said first driving circuit along the air current in said housing; and
(iv) a cooling unit configured to regulate a temperature of the air exhausted from inside said housing through said exhaust outlet so as to decrease a temperature difference between the air taken into said housing through said supply inlet and the air exhausted from inside said housing through said exhaust outlet.

* * * * *